US012590367B2

(12) United States Patent
Wesslin et al.

(10) Patent No.: US 12,590,367 B2
(45) Date of Patent: Mar. 31, 2026

(54) PRECURSOR SUPPLY CHAMBER

(71) Applicant: BENEQ OY, Espoo (FI)

(72) Inventors: Johannes Wesslin, Espoo (FI); Matti Malila, Espoo (FI); Pekka Soininen, Espoo (FI)

(73) Assignee: BENEQ OY, Espoo (FI)

( * ) Notice: Subject to any disclaimer, the term of this patent is extended or adjusted under 35 U.S.C. 154(b) by 628 days.

(21) Appl. No.: 17/605,633

(22) PCT Filed: Apr. 24, 2020

(86) PCT No.: PCT/FI2020/050269
§ 371 (c)(1),
(2) Date: Oct. 22, 2021

(87) PCT Pub. No.: WO2020/216996
PCT Pub. Date: Oct. 29, 2020

(65) Prior Publication Data
US 2022/0220614 A1      Jul. 14, 2022

(30) Foreign Application Priority Data

Apr. 25, 2019    (FI) ...................................... 20195336

(51) Int. Cl.
*C23C 16/448* (2006.01)
*C23C 16/455* (2006.01)
(52) U.S. Cl.
CPC .... *C23C 16/4485* (2013.01); *C23C 16/45544* (2013.01); *C23C 16/45561* (2013.01)
(58) Field of Classification Search
CPC .......... C23C 16/4485; C23C 16/45544; C23C 16/45561; C23C 16/448; C23C 16/45525; F17C 13/00
See application file for complete search history.

(56) References Cited

U.S. PATENT DOCUMENTS 5,186,120 A * 2/1993 Ohnishi .............. C23C 16/4481
                                              118/724
5,377,429 A    1/1995 Sandhu et al.
                    (Continued)

FOREIGN PATENT DOCUMENTS

KR    20080012125 A    2/2008

OTHER PUBLICATIONS

Finnish Search Report issued by the Finnish Patent and Regsitration Office in relation to Finnish Application No. 20195336 dated Nov. 14, 2019 (2 pages).
                    (Continued)

*Primary Examiner* — Jeffrie R Lund
(74) *Attorney, Agent, or Firm* — Carter, DeLuca & Farrell LLP

(57)        ABSTRACT

A precursor supply chamber for accommodating a precursor container in connection with an atomic layer deposition apparatus includes chamber walls defining a chamber space inside the precursor supply chamber. The precursor supply chamber also includes a chamber door assembly arranged to close the precursor supply chamber in a gas tight manner, a first heating element provided to the precursor supply chamber and arranged to heat the precursor container inside the chamber space of the precursor supply chamber and a gas tight precursor connection provided to the chamber walls for supplying precursor from the precursor container outside the precursor supply chamber.

20 Claims, 11 Drawing Sheets

(56)                References Cited

U.S. PATENT DOCUMENTS

| | | | | |
|---|---|---|---|---|
| 5,451,258 | A  * | 9/1995 | Hillman | C23C 16/4485 |
| | | | | 118/724 |
| 5,832,177 | A  * | 11/1998 | Shinagawa | H01L 21/67017 |
| | | | | 392/397 |
| 6,158,454 | A  * | 12/2000 | Duret | B08B 15/00 |
| | | | | 137/884 |
| 7,390,535 | B2 * | 6/2008 | Fairbourn | C23C 16/448 |
| | | | | 427/253 |
| 8,137,462 | B2 * | 3/2012 | Fondurulia | C23C 16/4402 |
| | | | | 118/724 |
| 8,518,181 | B2 * | 8/2013 | Hara | C23C 16/45525 |
| | | | | 118/726 |
| 8,986,456 | B2 * | 3/2015 | Fondurulia | C23C 16/4481 |
| | | | | 118/726 |
| 9,388,492 | B2 * | 7/2016 | White | C23C 16/45544 |
| 9,556,518 | B2 * | 1/2017 | Nagase | C23C 16/448 |
| 11,393,703 | B2 * | 7/2022 | Lerner | C23C 16/45574 |
| 11,624,113 | B2 * | 4/2023 | White | C23C 16/448 |
| | | | | 118/725 |
| 12,460,294 | B2 * | 11/2025 | Sharma | C23C 16/4485 |
| 2001/0042523 | A1 | 11/2001 | Kesala | |
| 2005/0000428 | A1 | 1/2005 | Shero et al. | |
| 2011/0008540 | A1 | 1/2011 | Na et al. | |
| 2017/0121814 | A1 | 5/2017 | Caymax | |
| 2018/0094351 | A1 | 4/2018 | Verghese et al. | |
| 2018/0163307 | A1 | 6/2018 | Carlson | |
| 2019/0055649 | A1 | 2/2019 | Lee et al. | |
| 2022/0220614 | A1 * | 7/2022 | Wesslin | C23C 16/45561 |
| 2022/0243328 | A1 * | 8/2022 | Soininen | C23C 16/45561 |

OTHER PUBLICATIONS

International Search Report issued by the Finnish Patent and Regsitration Office acting as the International Searching Authority in relation to International Application No. PCT/FI2020/050269 dated Jul. 17, 2020 (5 pages).

Written Opinion of the Internationa Searching Authority issued by the Finnish Patent and Regsitration Office acting as the International Searching Authority in relation to International Application No. PCT/FI2020/050269 dated Jul. 17, 2020 (8 pages).

Szkutnik, P. D., et al., "Qualification of a sublimation tool applied to the case of metalorganic chemical vapor deposition of $In_2O_3$ from In (tmhd) 3 as a solid precursor," Review of Scientific Instruments, Feb. 2016, 9 pages, 87.2.

European Supplemental Search Report for application No. 20795118.7, May 20, 2022, 4 pages.

* cited by examiner

PRECURSOR SUPPLY CHAMBER

CROSS-REFERENCE TO RELATED APPLICATIONS

This application is a national phase entry under 35 U.S.C. 371 of PCT International Application No. PCT/FI2020/050269 filed Apr. 24, 2020, which claims priority to Finnish Patent Application No. 20195336, filed Apr. 25, 2019, the disclosure of each of these applications is expressly incorporated herein by reference in their entirety.

FIELD OF THE INVENTION

The present invention relates to a precursor supply chamber and more particularly to a precursor supply chamber for accommodating a precursor container in connection with an atomic layer deposition method. The present invention also relates to a precursor supply cabinet for a precursor supply system.

BACKGROUND OF THE INVENTION

Precursor gases are supplied from precursor containers or precursor vessels to a reaction chamber of an atomic layer deposition apparatus. A substrate to be processed is further placed into the reaction chamber such that it may be processed with the precursor gases according to principles of atomic layer deposition. The precursor containers are conventionally arranged into a ventilated space and precursor conduits extend from the precursor containers in the ventilated space towards the reaction chamber. The precursors are further supplied to the reaction chamber in heated state. Therefore, the precursor containers and the precursor conduits are insulated and heated with heating elements for maintaining the precursors at the elevated temperature in the ventilated space and for preventing decrease of precursor temperature and condensation.

One of the disadvantages associated with the prior art is that all precursor containers and precursor conduits have to be separately insulated and heated in the ventilated space. This makes controlling the temperatures difficult and complicated. Different precursor materials require different temperatures and therefore each precursor container and precursor conduit must be separately insulated and heated. However, the heated precursor containers and precursor conduits affect each other making the control of temperatures difficult.

BRIEF DESCRIPTION OF THE INVENTION

An object of the present invention is to provide a precursor supply chamber and a precursor supply cabinet so as to overcome or at least alleviate the prior art disadvantages.

The preferred embodiments of the invention are disclosed in the dependent claims.

The present invention is based on the idea of providing a precursor supply chamber for accommodating a precursor container in connection with an atomic layer deposition apparatus. The precursor supply chamber comprises chamber walls defining a chamber space inside the precursor supply chamber. The precursor supply chamber further comprises a chamber door assembly arranged to close the precursor supply chamber in gas tight manner, a first heating element provided to the precursor supply chamber and arranged to heat the precursor container inside the chamber space of the precursor supply chamber, and a gas tight precursor connection provided to the chamber walls for supplying precursor from the precursor container outside the precursor supply chamber.

The precursor supply chamber further comprises a precursor container holder inside the precursor supply chamber for holding the precursor container, the first heating element is provided to the precursor container holder for heating the precursor container held by the precursor container holder. Accordingly, the precursor container is placed on the precursor container holder inside the chamber space. The precursor container may be placed on the heated precursor container holder inside the chamber space enabling heating the precursor container.

The precursor supply chamber also comprises a precursor supply element arranged to control precursor supply from the precursor container to outside the precursor supply chamber via the gas tight precursor connection. The precursor supply element is arranged above the precursor container holder inside the precursor supply chamber. The precursor container is connected to the precursor supply element with a precursor container supply line extending from the precursor container to the precursor supply element.

The precursor supply chamber further comprises a second heating element provided above the precursor container holder in the precursor supply chamber.

Based on the above mentioned, the precursor container holder may be arranged to two lower part of the chamber space of the precursor supply chamber and the precursor supply element may be arranged to the upper part of the chamber space and/or above the precursor container or the precursor container holder. Accordingly, precursor gas may be supplied from the precursor container in the lower part of the chamber space to the precursor supply element in the upper part of the chamber space. This is advantageous, as the heat rises towards the upper part of the chamber space in the precursor supply chamber and thus precursor gas flows in a direction of increasing temperature gradient from the precursor container inside the chamber space.

Accordingly, the second heating element may provide and/or enhance the increasing temperature and temperature gradient inside the chamber space towards the upper part of the chamber space. This allows ensuring that the precursor gas may be supplied from the precursor container in a direction the increasing temperature gradient. The increasing temperature gradient may be achieved by providing a higher temperature or by utilizing higher heating power in the second heating element than in the first heating element. Increasing temperature gradient prevents the gaseous precursor from condensing during supply.

Further, the precursor supply chamber accommodates the precursor container in a gas tight chamber in which the precursor container is heated with the first heating element. Thus, the temperature of the precursor container and precursor may be controlled in detail as the precursor container is arranged in controlled atmosphere inside the gas tight precursor supply chamber.

In the context of this application, in relation to precursor supply chamber gas tight means that there is substantially no gas flow between the chamber space inside the precursor supply chamber and the outside of the precursor supply chamber. Accordingly, gas tight means that leakage flow is less than 5 standard litres per minute (slm) into the chamber space of the precursor supply chamber from outside of the precursor supply chamber, or between the chamber space and the outside of the precursor supply chamber. Preferably, the gas tight means that the above mentioned leakage flow between 0 to 5 slm, or less than 3 slm, or more preferably less than 1 slm.

Similarly, in the context of this application, in relation to the precursor connection gas tight means that there is substantially no gas flow between the inner space of the precursor connection and the outside of the precursor connection. Accordingly, gas tight means that leakage flow is less than 5 standard litres per minute (slm) into the inner space of the precursor connection from outside of the precursor connection, or between the inner space and the outside of the precursor connection. Preferably, the gas tight means that the above mentioned leakage flow is between 0 to 5 slm, or less than 3 slm, or more preferably less than 1 slm. The precursor connection may be preferably provided vacuum tight for forming a vacuum tight precursor connection. Vacuum tight means that the leakage flow is less than 0.5 slm or less than 0.1 slm or preferably the leakage is substantially 0 slm.

In one embodiment, the first heating element is provided to lower part of the chamber space of the precursor supply chamber. Arranging the first heat element in the lower part of the chamber space enables controlling the temperature inside the chamber space and thus the temperature of the precursor container in detail. Due to natural convection, heated gas rises upwards in the chamber space and thus the lower temperatures inside the chamber space may be controlled with the first heating element.

In one embodiment, the precursor supply chamber comprises a bottom wall.

In one embodiment, the precursor container holder is arranged at bottom of the chamber space of the precursor supply chamber. Thus, there is enough room for the precursor container and the heating of the precursor container may be carried out such that heat rises upwards in the chamber space.

In another embodiment, the precursor container holder is arranged to lower part of the chamber space of the precursor supply chamber.

In a yet alternative embodiment, the precursor container holder is arranged on bottom wall of the precursor supply chamber or in the vicinity thereof. This enables maximising the inner space of the chamber space and heating the precursor container from underneath.

In one embodiment, the precursor supply chamber comprises a precursor supply element arranged to control precursor supply from the precursor container to outside the precursor supply chamber via the gas tight precursor connection. The precursor container is connected to the precursor supply element with a precursor container supply line extending from the precursor container to the precursor supply element.

In one embodiment, the precursor supply chamber comprises one or more gas valves arranged to control precursor supply from the precursor container outside the precursor supply chamber via the gas tight precursor connection.

In another embodiment, the precursor supply element comprises one or more gas valves arranged to control precursor supply from the precursor container outside the precursor supply chamber via the gas tight precursor connection.

The precursor container is connected to the precursor supply element and the gas valves with the precursor container supply line for supplying precursor from the precursor container to the precursor supply element and further t outside the precursor supply chamber via the gas tight precursor connection.

In one embodiment, the precursor supply element is arranged to upper part of the chamber space of the precursor supply chamber.

In yet another embodiment, the precursor supply chamber comprises a top wall, and the precursor supply element is arranged in connection with the top wall.

In one embodiment, the precursor supply chamber comprises the second heating element provided to the upper part of the chamber space of the precursor supply chamber.

In a yet alternative embodiment, the precursor supply chamber comprises the second heating element provided above the precursor container holder in the precursor supply chamber.

In one embodiment, the second heating element is provided to the top wall or in connection with the top wall of the precursor supply chamber.

In another embodiment, the second heating element is provided to the precursor supply element.

Providing the second heating element to the precursor supply element enables heating the precursor gas as it flows through the precursor supply element. Thus, temperature of the precursor gas may be increased downstream of the precursor container.

In one embodiment, the precursor supply chamber comprises a third heating element provided to the gas tight precursor connection.

The third heating element enables heating the precursor in the gas tight precursor connection downstream of the precursor supply element. Thus, temperature of the precursor gas may be further increased downstream of the precursor supply element for providing the increasing temperature gradient from the precursor container via the precursor supply element to the gas tight precursor supply connection.

In one embodiment, the chamber walls of the precursor supply chamber are made of metal such that the metal chamber walls define the chamber space of the precursor supply chamber.

In another embodiment, the chamber walls comprise a metal inner wall layer defining the chamber space of the precursor supply chamber.

In yet another embodiment, the chamber walls comprise a metal inner wall layer and a metal outer wall layer, the metal inner wall layer defining the chamber space of the precursor supply chamber.

The metal chamber walls or metal inner wall layer provide wall structure which does not cause particles into the chamber space. Further, the meat wall structure may provide thermal mass which may store thermal energy for minimizing temperature variations inside the chamber space. The metal wall or meta inner layer may be for example made of steel or stainless steel or aluminium.

In one embodiment, the chamber walls are provided with thermal insulation. The thermal insulation prevents thermal energy from escaping from the chamber space and minimizes temperature variations inside the chamber space due to outside conditions.

In another embodiment, the chamber walls are provided with thermal insulation layer arranged between the metal inner wall layer and the metal outer wall layer.

Further in another embodiment, the chamber walls comprise metal surface layers and a thermal insulation encapsulated inside the chamber walls between the metal surface layers.

Providing the thermal insulation or thermal insulation layer between the inner wall layer and outer wall layer or encapsulating the thermal insulation between the surface layers of the chamber walls enables keeping the thermal insulation away from the chamber space such that thermal insulation is not deteriorated or damaged during using the precursor supply chamber. Further, particles from the thermal insulation are not released to the chamber space.

In one embodiment, the chamber door assembly comprises a chamber door and a sealing member arranged to seal the precursor supply chamber when the chamber door is in closed position.

The sealing member may be provided to the door or to the door assembly or to the door opening, meaning edges of the door opening, for sealing the door assembly when the chamber door is closed. Thus, the sealing member may be provided enhance of provide the gas tightness of the door assembly for closing the precursor supply chamber in gas tight manner.

In one embodiment, the chamber door assembly comprises the chamber door and a closing mechanism arranged to pre-stress the chamber door to the closed position and/or lock the door to the closed position.

The closing mechanism may comprise lock, latch or the like for closing or pre-stressing the door to the closed position. The closing mechanism may also comprise hydraulic cylinder or spring or elastic pre-stressing means for pre-stressing the door to the closed position. In some embodiment, the sealing member of the door assembly may for or be part of the pre-stressing means. The pre-stressing means further enable providing or enhancing the gas tight closing of the precursor supply chamber.

The present invention further relates to a precursor supply cabinet for a precursor supply system in connection with an atomic layer deposition apparatus. The precursor supply cabinet comprises a ventilation inlet connection arranged to provide ventilation gas into the precursor supply cabinet and a ventilation discharge connection arranged to discharge ventilation gas from the precursor supply cabinet. The precursor supply cabinet further comprises one or more gas tight precursor supply chambers inside the precursor supply cabinet.

The one or more precursor supply chambers arranged to accommodate a precursor container in connection with an atomic layer deposition apparatus. According to the present invention the precursor supply chamber comprises chamber walls defining a chamber space inside precursor supply chamber. The precursor supply chamber comprises a chamber door assembly arranged to close the precursor supply chamber in gas tight manner, a first heating element provided to the precursor supply chamber and arranged to heat the precursor container inside the chamber space of the precursor supply chamber, and a gas tight precursor connection provided to the chamber walls for supplying precursor from the precursor container outside the precursor supply chamber.

The one or more gas tight precursor supply chambers are preferably precursor supply chambers as described above for arranging the one or more gas tight precursor supply chambers in the ventilated precursor supply cabinet.

Accordingly, the gas tight precursor supply chambers are arranged into the ventilated inner cabinet space. The gas tight structure of the precursor supply chambers enable preventing the ventilation gas from entering the chamber space of the precursor supply cabinet. Thus, the precursor container may be kept in controlled atmosphere inside the heated precursor supply chamber.

An advantage of the invention is that the temperature of the precursor container and thus the precursor may be controlled in detail. The gas tight structure of the precursor supply cabinet enables providing a controlled environment inside the chamber space without subjecting the precursor container to gas flows which may have cooling effect. Further, the precursor supply chamber of the present invention enables providing increasing temperature gradient along the supply path of the precursor inside the precursor supply chamber and out of the precursor supply chamber. Thus, condensation problems may be avoided. Furthermore, if precursor leakage occurs the precursor is not released from the precursor supply chamber but may be contained. The precursor supply chamber makes separate heating elements unnecessary and thus the precursor supply system is more simple and easier to install and maintain.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
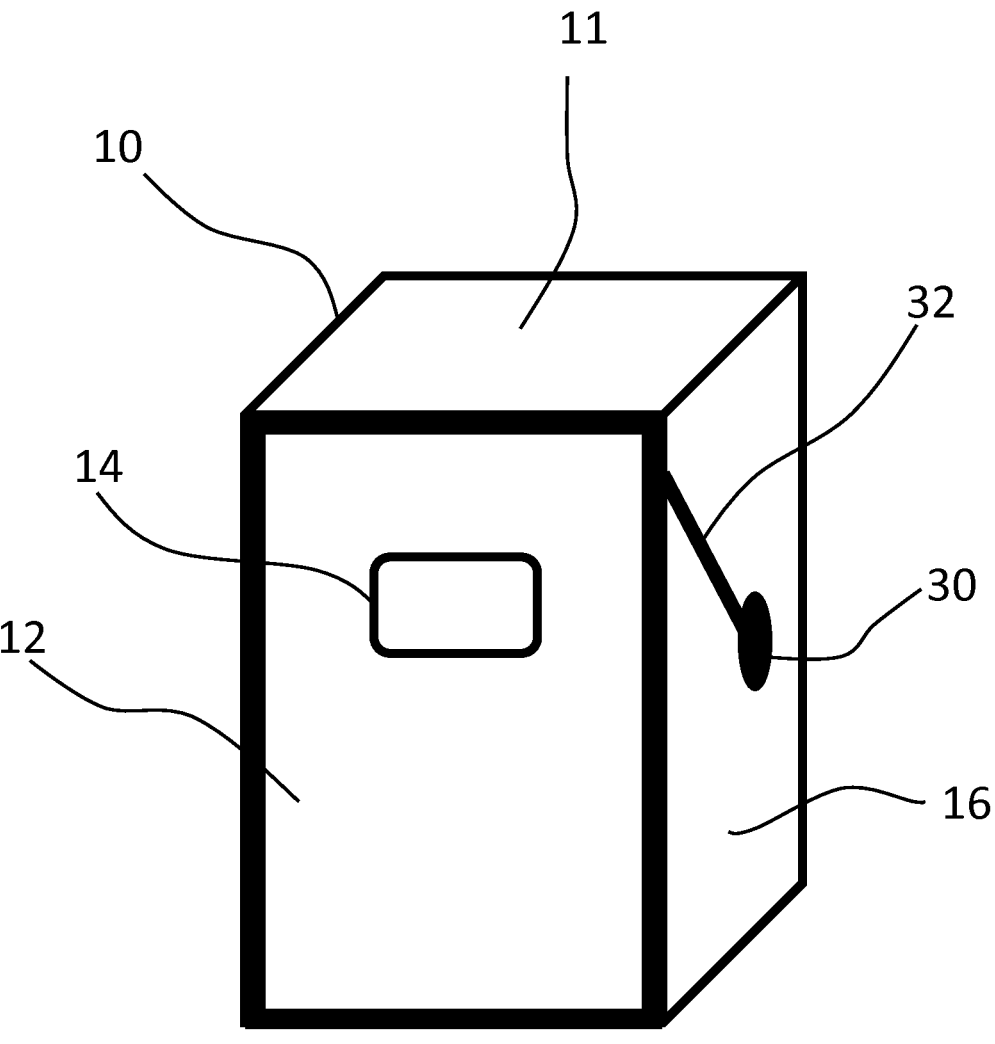
FIG. 1 shows a schematic view of the precursor supply chamber of one embodiment of the present invention.

FIG. 1 shows a schematic view of a precursor supply chamber 10 according to one embodiment of the invention. A precursor container or precursor vessel is placed or accommodated inside the precursor supply chamber 10 during operating an atomic layer deposition apparatus. The precursor supply chamber 10 may be further placed or accommodated inside a ventilated precursor supply cabinet.

The precursor supply chamber 10 comprises chamber walls 11, 13, 15, 16, 18 defining a chamber space or inner chamber space 19 inside the precursor supply chamber 10, as shown in FIGS. 1 to 4. The chamber walls 11, 13, 15, 16, 18 further for the chamber body.

In the FIGS. 1 to 10, the precursor supply chamber comprises a top wall 11 and a bottom wall 13 and side walls 12, 15, 16, 18 extending between the top wall 11 and the bottom wall 13.

The precursor supply chamber 10 further comprises a chamber door assembly 12, 30, 32 arranged to close the precursor supply chamber 10 or the inner chamber space 19 in gas tight manner. The chamber door assembly 12, 30, 32 comprises a chamber door 12 arranged in connection of a door opening 21 of the precursor supply chamber 10.

The door opening 21 may be provided on one side walls 12, 15, 16, 18 or top wall 11 or the bottom wall 13 of the precursor supply chamber 10. In the embodiment, of the FIGS. 1 to 10 the door opening 21 is provided to one of the side walls, and especially the front wall of the precursor supply chamber 10. As shown in FIG. 4, the door opening 21 is defined by the chamber body or the chamber walls 11, 13, 15, 16. Especially, the door opening 21 is defined by the side walls 15, 16 and the top wall 11 and the bottom wall 13, or the edges thereof.

The wall opening 21 covers the whole front wall of the precursor supply chamber 10.

The chamber door 12 is arranged in connection with the door opening 21 for opening and closing the door opening 21 and also for opening and closing the precursor supply chamber 10 and the inner chamber space 19 thereof.

The chamber door 12 comprises door window 14 arranged to provide visual contact to the inner chamber space 19 when the chamber door 12 is in closed position.

The chamber door assembly further comprises a door opening and closing mechanism (not shown). The door opening and closing mechanism may comprise hinges or the like enabling opening and closing the chamber door. In the embodiment of the figures, the hinges may be provided to bottom edge of the door 12. The hinges may also be arranged to some other edge of the chamber door 12.

FIG. 1 shows the precursor supply chamber 10 in closed state and the chamber door assembly 12, 30, 32 in closed position. Accordingly, the chamber door 12 is in closed position and the precursor supply chamber 10 and the inner chamber space 19 closed in gas tight manner. Thus, the chamber door assembly 12, 30, 32 arranged to close the door opening 21 of the precursor supply chamber 10 in gas tight manner.

Gas tight means in relating to the chamber door assembly, that leakage flow via the chamber door 12 or the door assembly 12, 30, 32 is less that 5 slm, or preferably less than 3 slm or more preferably less than 1 slm.

The chamber door assembly 12, 30, 32 further comprises a closing mechanism 30, 32 arranged to pre-stress the chamber door 12 to the closed position. In the closed position the chamber door 12 is pre-stressed against the chamber body and the chamber walls 11, 13, 15, 16 defining the door opening 21.

Figure 2:
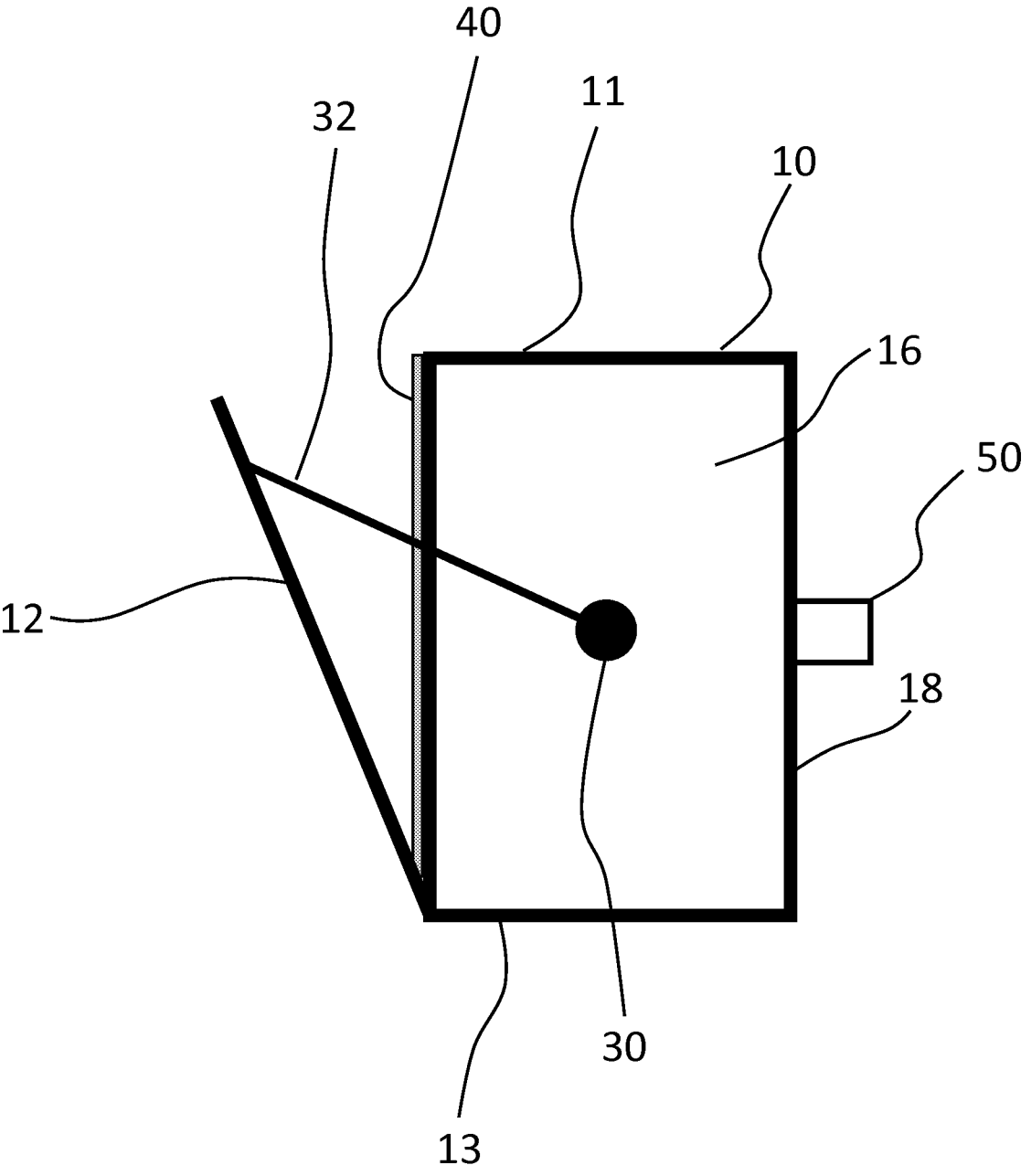
FIGS. 2 and 3 show schematic side views of one precursor supply chamber according to the present invention.
Figure 3:
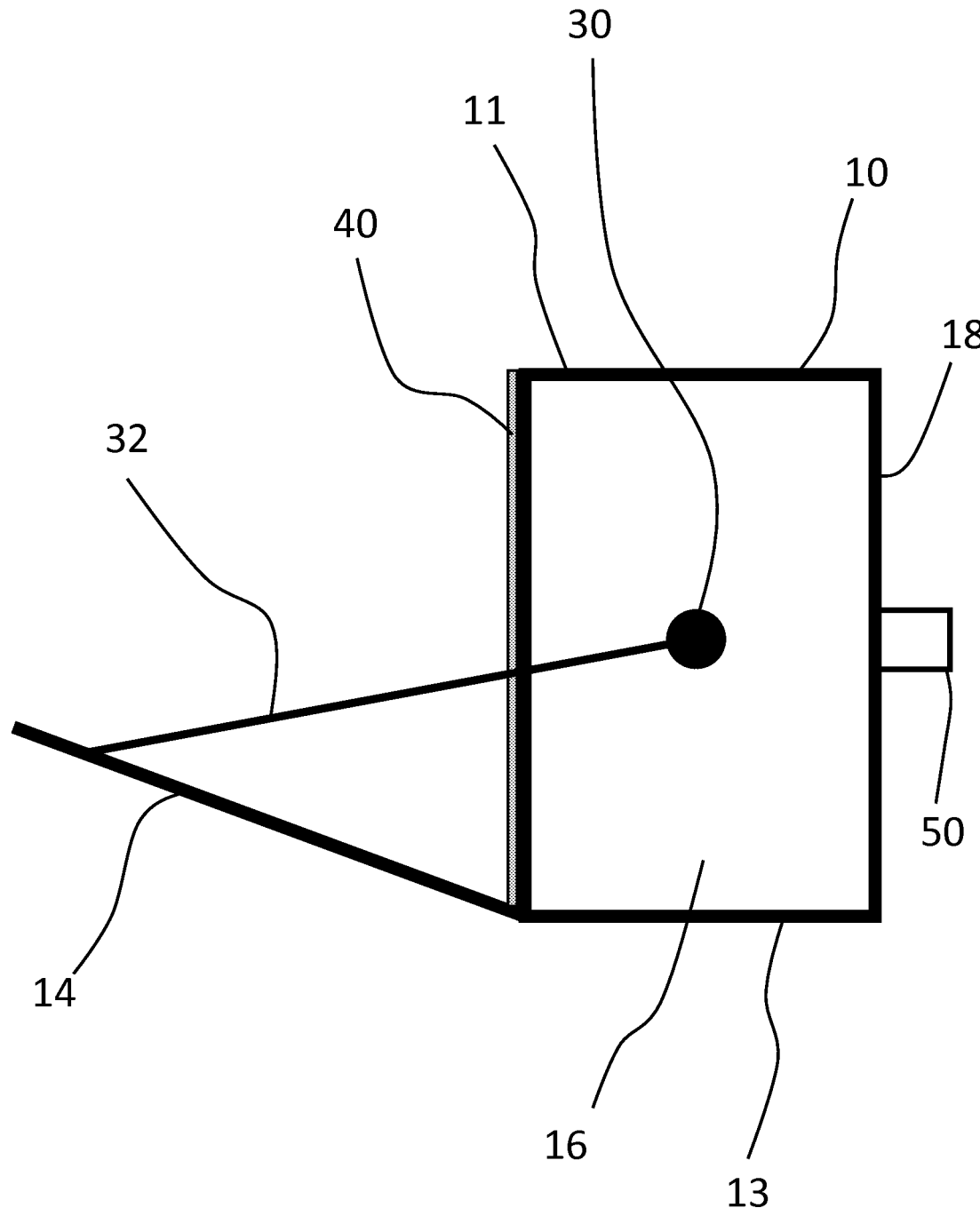
Figure 4:
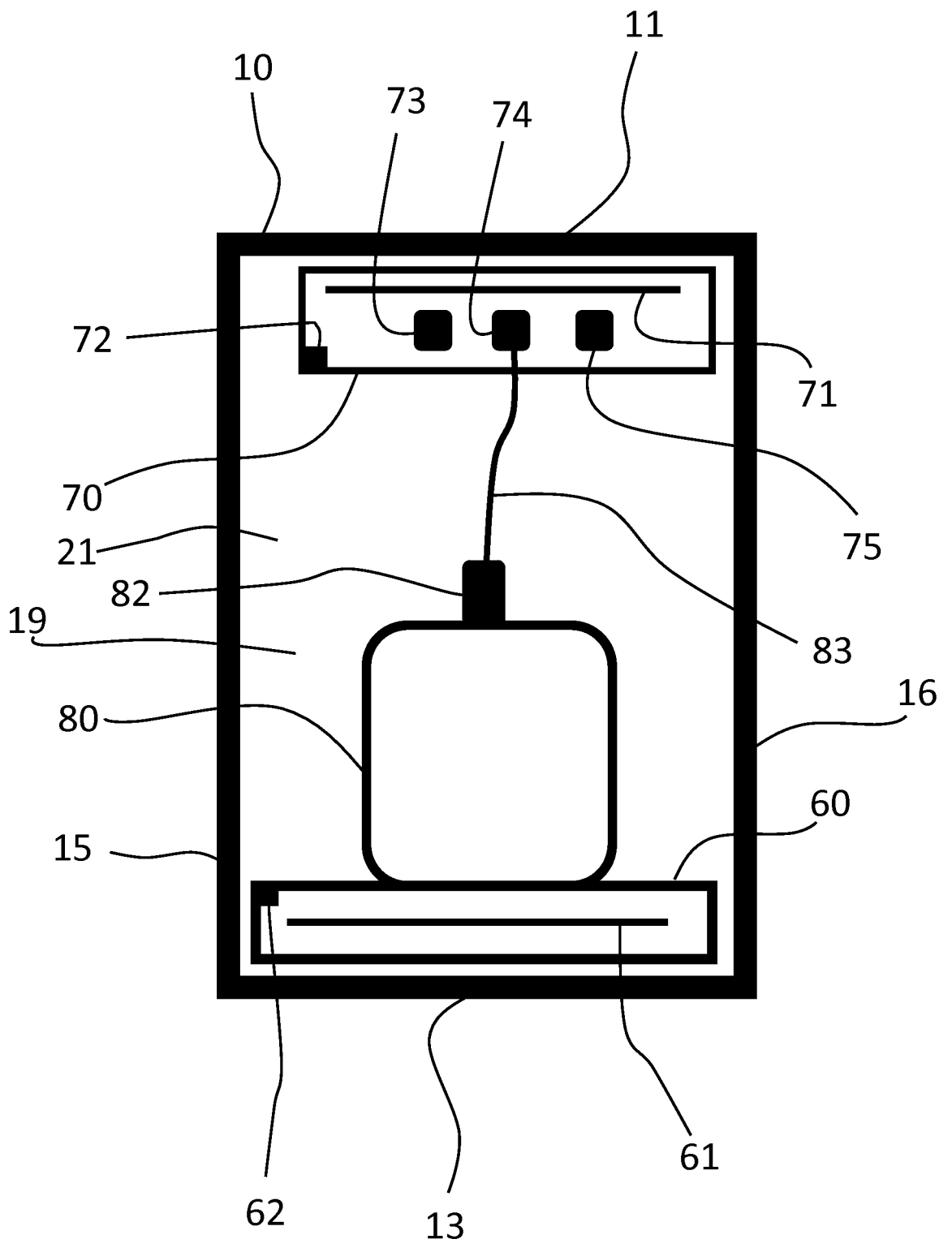
FIGS. 4 and 5 show schematic front views and chamber spaces precursor supply chambers according to the present invention.

In the embodiment of FIGS. 1 to 3, the closing mechanism comprises gas struts 32 connected to the chamber body or the side walls 15, 16 precursor supply chamber 10 at pivot points 30 and to the chamber door 12. Accordingly, the gas struts 32 extend between the chamber body or side walls 15, 16 and the chamber door 12. The gas struts 32 are arranged to press the chamber door 12 against the chamber body 11, 13, 15, 16 in the closed position for closing the precursor supply chamber 10 in gas tight manner.

In a preferred embodiment, there is a gas strut 32 on both sided of the chamber door 12 and on opposite side walls 15, 16.

The closing mechanism is arranged to pull the chamber door 12 towards the closed position when the chamber door 12 is opened, as shown in FIG. 2. However, the when the chamber door 12 is opened over a threshold point, for example when the gas struts 32 rotate past the horizontal position over the pivot point 30, the closing mechanism or the gas struts pull or keep the chamber door in open position as shown in FIG. 3.

Therefore, when opening the chamber door 12 over the threshold point, the closing mechanism will keep the chamber door 12 open. However, when opening the chamber door

12 less than the threshold point, the closing mechanism will pull the chamber door towards closed position.

The gas struts 32 may be replaced by springs of the like.

Further, the closing mechanism may comprise also a lock or latch for securing the chamber door to the closed position. The lock or latch may also comprise pre-stressing means, for example an elastic member or spring, for pre-stressing the chamber door 12 to the closed position. In some embodiments, the lock or latch may provide the sole pre-stressing means and the sole closing mechanism.

As shown in FIGS. 2 and 3, the chamber door assembly further comprises a sealing member 40 arranged to seal the precursor supply chamber 10 when the chamber door is in closed position. The sealing member 40 is provided to the chamber body and to the door opening 21. Accordingly, the sealing member 40 is provided to the edges of the side walls 15, 16, the top wall and the bottom wall 13 at the door opening 21.

Alternatively or additionally, a sealing element 40 may be provided to the chamber door 12.

The sealing element 40 is arranged between the chamber body and the chamber door 12, or between the side walls 15, 16, the top wall and the bottom wall 13, or edges thereof, and the door opening 21 in the closed position of the chamber door 12 for sealing the inner chamber space 19 and the precursor supply chamber 10 in gas tight manner.

The precursor supply chamber 10 is comprises a first heating element 61 provided to the precursor supply chamber 10 and arranged to heat a precursor container 80 inside the chamber space 19 of the precursor supply chamber 10.

In the embodiment of FIG. 4, the precursor supply chamber 10 comprises a precursor container holder 60 inside the precursor supply chamber 10 for holding the precursor container 80. The precursor container holder 60 is arranged at bottom of the chamber space 19 of the precursor supply chamber 10, or to lower part of the chamber space of the precursor supply chamber 10. Further, the precursor container holder 60 is arranged on bottom wall 13 of the precursor supply chamber 10 or in the vicinity thereof inside the chamber space 19. The precursor container 80 further placed on the precursor container holder 60. The precursor container holder 60 is provided as precursor container base in the embodiment of FIG. 4.

The first heating element 61 is provided to the precursor container holder 60 for heating the precursor container 80 held by or on the precursor container holder 60. Thus, the first heating element 61 may heat the precursor container 80 on the precursor container holder 60 for heating the precursor inside the precursor container 80. Thus, the first heating element 61 may be arranged to heat the precursor container 80 from the bottom.

The first heating element 61 may be an electrical heating element or a liquid heating element in which heating liquid is circulated, or some other heating element.

The first heating element 61 is thus arranged to heat the precursor container holder 60 which in turn heats the precursor container 80.

Figure 5:
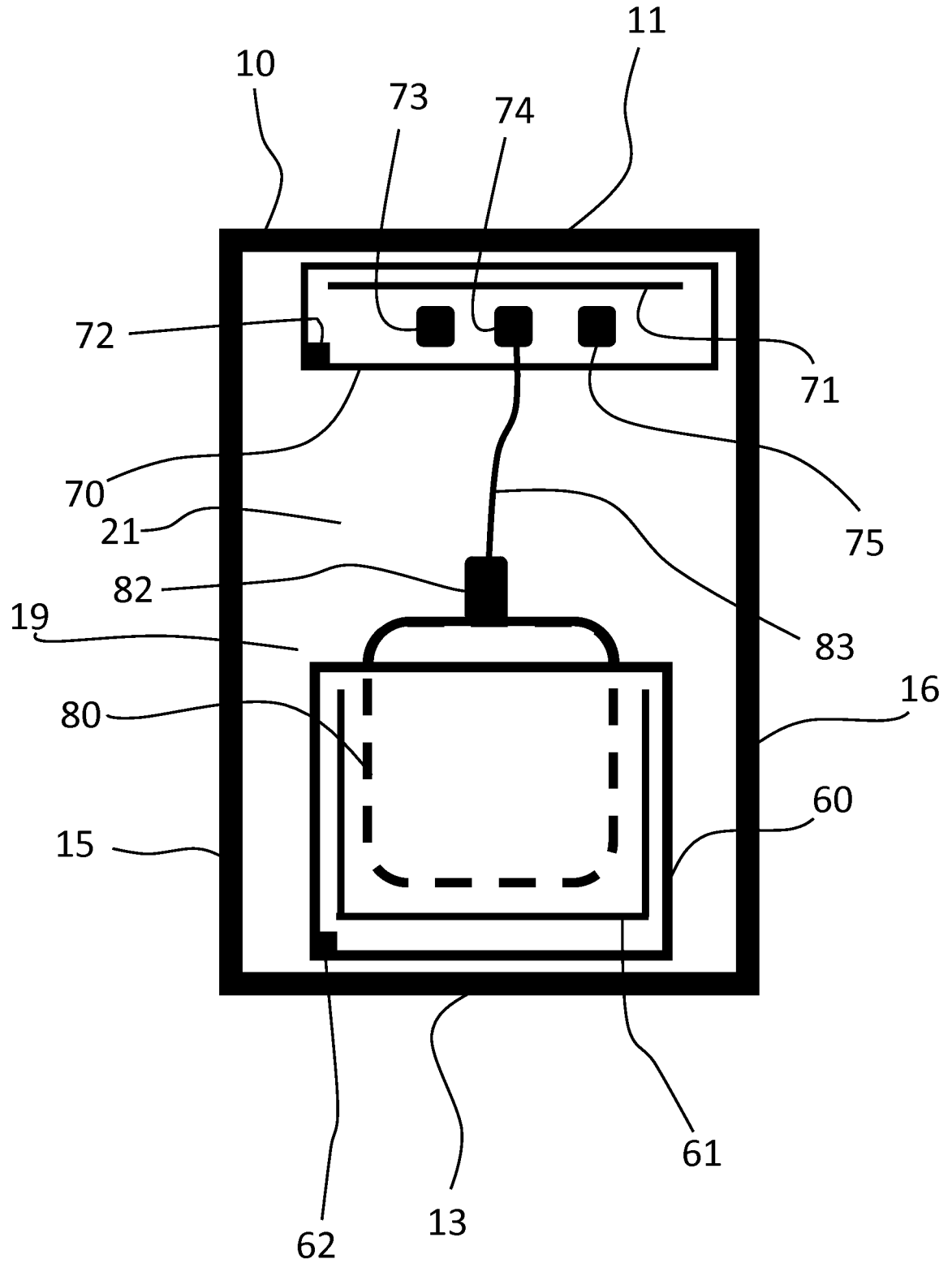

FIG. 5 shows another embodiment, in which the precursor container holder 60 is formed as a vessel and the first heating element 61 is provided to the vessel. The precursor container holder 60 may receive the precursor container 80 into the vessel at least partly. Thus, the first heating element 61 may be arranged to heat the precursor container 80 from the bottom and from the side. The precursor container holder 60 of FIG. 5 may also be formed as a collar which may be arranged around the precursor container 80. The first heating element 61 may be provided to the collar and arranged to heat the precursor container 80 from the side.

In all the above embodiments, the precursor container 80 and the also the first heating element 61 are arranged to the lower part of the chamber space 19.

In an alternative embodiment, the first heating element 61 may be provided to lower part B of the chamber space of the precursor supply chamber 10. Further, the first heating element 61 may be provided in connection with the bottom wall 13 or on the bottom wall 13 inside the chamber space 19.

In a further embodiment, the first heating element 61 may provided to the bottom wall 13. Thus, the first heating element 61 may be embedded inside to the bottom wall 13.

In the latter embodiments, the precursor container holder 60 may be omitted, if desired.

The precursor container holder 60 may be provided removable such that the may be removed from the precursor supply chamber 10 or it may be placed to the precursor supply chamber 10 together with the precursor container 80.

The precursor supply chamber 10 further comprises a gas tight precursor connection 50 provided to the chamber walls 11, 13, 15, 16, 18 for supplying precursor from the precursor container 80 outside the precursor supply chamber 10. As shown in FIGS. 2 and 3, the gas tight precursor connection 50 extends from the chamber walls 11, 13, 15, 16, 18 and provides a gas tight lead-through into the chamber space 19 from outside of the precursor supply chamber. Thus, the gas tight precursor connection is open to the inner chamber space 19 and provides gas tight connection into the inner space chamber 19 from outside of the precursor supply chamber 10.

Gas tight in relation to the precursor connection 50 means that leakage flow into the precursor connection from outside is less than 5 slm or between 0 to 5 slm, or less than 3 slm, or more preferably less than 1 slm. The precursor connection 50 is be preferably provided vacuum tight for forming a vacuum tight precursor connection 50. Vacuum tight means that the leakage flow is less than 0.5 slm or less than 0.1 slm or preferably the leakage is substantially 0 slm.

The gas tight precursor connection 50 is used providing gases in and out of the precursor supply chamber 10 and for supplying electricity into the precursor supply chamber 10, or the like.

In the embodiment of the figures, the gas tight precursor connection 50 is provided to back side wall 18 of the precursor supply chamber 10 opposite the door opening 21 and the chamber door 12.

The precursor supply chamber 10 further comprises a precursor supply element 70 arranged to control precursor supply from the precursor container 80 to outside the precursor supply chamber 10 via the gas tight precursor connection 50, as shown in FIGS. 4 and 5. The precursor supply element 70 is provided as a block or the like with gas connections for supplying precursor from the precursor container 80 via the precursor connection 50 outside the precursor supply chamber 10 to an atomic layer deposition reactor.

The precursor supply element 70 comprises one or more gas valves 73, 74, 75 arranged to control precursor supply from the precursor container 80 outside the precursor supply chamber 10 via the gas tight precursor connection 50.

The precursor supply element 70 may comprise for example a carrier gas valve 73, a precursor valve 74 and a supply valve 75, as shown in FIGS. 4 and 5. Accordingly, the valves 73, 74, 75 may be attached fixedly or detachably to the precursor supply element 70.

The precursor supply element 70 is arranged to upper part of the chamber space 19 of the precursor supply chamber.

The precursor supply element 70 is arranged above the precursor container holder 60 inside the precursor supply chamber 10, when the precursor supply chamber 10 comprises the precursor container holder 60.

Further, in one embodiment the precursor supply element 70 is arranged in connection with the top wall 11. The precursor supply element 70 may be attached to the top wall 11 inside the inner chamber space 19 or it may be attached to the side wall 15, 16, 18 in vicinity of the top wall 11.

In one embodiment, the precursor supply element 70 is attached removable to the precursor supply chamber 10 and inside the inner chamber space 19. Thus, the precursor supply element 70 may be provided as removable element to the precursor supply chamber 10. Thus, all the gas valves 73, 74, 75 may be removed simultaneously by removing the precursor supply element 70. This makes maintenance work simpler.

In an alternative embodiment, the precursor supply element 70 may be omitted and the gas valves may be provided to the precursor supply chamber 10 as separate parts. The one or more separate gas valves 73, 74, 75 are arranged to control precursor supply from the precursor container 80 outside the precursor supply chamber 10 via the gas tight precursor connection 50.

The precursor supply chamber 10 further comprises a second heating element 71 provided to the upper part of the chamber space of the precursor supply chamber 10. Furthermore, the second heating element 71 is provided above the first heating element 61 inside the inner chamber space 19 of the precursor supply chamber 10.

Further, preferably the second heating element 71 is provided above the precursor container holder 60 in the precursor supply chamber 10, as shown in FIGS. 4, 5, 6 and 7.

As shown in the FIGS. 4 to 7, the second heating element 71 is provided to the precursor supply element 70. Therefore, the second heating element 71 is arranged to heat the precursor supply element 70 and further the precursor gas supplied from the precursor container 80 to the precursor supply element 70. The second heating element also keeps the gas valves 73, 74, 75, as gas conduits in the precursor supply element 70, at the desired temperature as they are provided to the same block. Thus, the temperature of the precursor may be controlled in detail inside the inner chamber space 19 when the precursor is supplied from the precursor container 80 out of the precursor supply chamber 10.

The second heating element 71 may be an electrical heating element or liquid heating element in which heated liquid is circulated, or some other heating element provided inside the chamber space 19.

The second heating element 71 is thus arranged to heat the gas valves and gas conduits in connection with the gas valves 73, 74, 75 for heating the precursor.

In an alternative embodiment, the second heating element 71 may be provided to upper part of the chamber space 19 of the precursor supply chamber 10. Further, the second heating element 71 may be provided in connection with the top wall 11 or on the top wall 11 inside the chamber space 19.

In a further embodiment, the second heating element 71 may be provided to the top wall 11. Thus, the second heating element 71 may be embedded inside to the top wall 11.

In the latter embodiments, the precursor supply element 70 may be omitted, if desired, and the gas valves 73, 74, 75 may be separate gas valves.

In all the above embodiments, the precursor supply element 70 and the also the second heating element 71 are arranged to the upper part of the chamber space 19.

Figure 6:
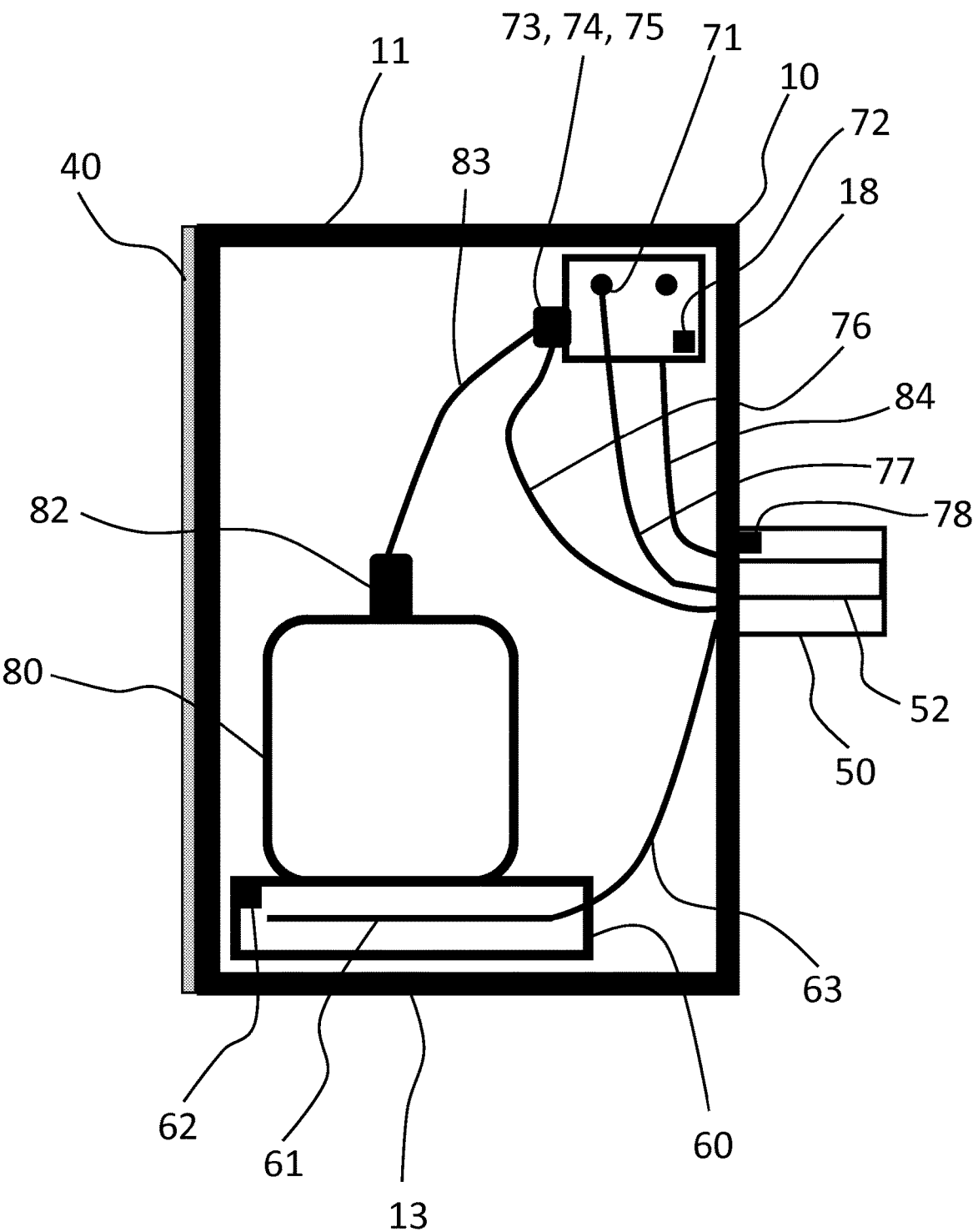
FIG. 6 shows a schematic side view and chamber space one precursor supply chamber according to the present invention.

As shown in FIG. 6, in this embodiment the precursor supply chamber 10 comprises a third heating element 52 provided to the gas tight precursor connection 50. The third heating element 52 may be provided inside the gas tight precursor connection 50 for heating gas conduits 76, 84 and thus the gases such as precursor gas in precursor conduit 76.

The third heating element 52 may be an electrical heating element or liquid heating element in which heated liquid is circulated, or some other heating element provided inside the gas tight precursor connection 50.

The precursor container 80 is a vessel and may comprise container valve 82 for opening and closing the precursor container 80, as shown in FIGS. 4, 5 and 6. The precursor container 80 is connected to a precursor valve 74 with the container conduit 82 extending between the precursor container 80 and the precursor valve 74.

The precursor supply chamber 10 may further comprise carried gas valve 73. A carrier gas conduit 84 is connected to the carrier gas valve 73. The carrier gas conduit 84 extends into the chamber space 19 and to the carrier gas valve 73 from the precursor connection 50. Thus, carrier gas is brought to the precursor supply chamber 10 from outside of the precursor supply chamber 10 via the precursor connection 50.

The precursor supply chamber 10 further comprises a precursor supply valve 75 arranged to supply the precursor out of the precursor supply chamber 10. There is precursor supply conduit 76 extending from the precursor supply valve 75 out of the precursor supply chamber 10 via the precursor connection 50.

The carrier gas conduit 84 and the container conduit 82 are connected to the precursor supply conduit 76 in a connection point and the precursor supply valve 75 is provided to the precursor supply conduit 76 downstream of the connection point. Further, the carrier gas valve 73 is provided to the carrier gas conduit 84 upstream of the connection point. The precursor valve 74 is provided to the container conduit 82 upstream of the connection point.

The carrier gas valve 73, precursor valve 74 and the precursor supply valve 75 are provided to the precursor supply element 70. However, in other embodiments they may also be provided as separate valves.

A first power line 63 is connected to the first heating element 61 and a second power line 77 is connected to the second heating element 71. The first and second power line 63, 77 extend to the precursor supply chamber 10 via the precursor connection 50. The first and second power line 63, 77 are arranged to provide electricity to the first and second electrical heating elements 61, 71, respectively. It should be noted, that the first and second power line 63, 77 may also be provided as liquid lines when the first and second heating element 61, 71 are provided as liquid heating elements.

Furthermore, it should be noted that the present invention is not restricted to any particular configuration gas conduits, gas valves or power lines, but they may vary within scope of the claims.

As shown in FIG. 6, the precursor supply chamber 10 comprises a first temperature sensor 62 arranged in connection with the first heating element 61.

The first temperature sensor 62 may be provided to the precursor container holder 60 for measuring the temperature of the precursor container holder 60 and thus the precursor container 80 and also the precursor.

Similarly, as shown in FIG. 6, the precursor supply chamber 10 comprises a second temperature sensor 72 arranged in connection with the second heating element 71.

The second temperature sensor 72 may be provided to the precursor supply element 70 for measuring the temperature of the precursor supply element 70 and thus the precursor or the valves during supply of the precursor.

Further, as shown in FIG. 6, the precursor supply chamber 10 comprises a third temperature sensor 78 arranged in connection with the precursor connection 50.

The third temperature sensor 78 may be provided to the precursor connection for measuring the temperature of the precursor connection 50 the precursor supply conduit 76 in the precursor connection 50 and the temperature precursor. The third heating element 52 is provided in connection with the precursor supply conduit 76 for heating the precursor supply conduit 76 in the precursor connection 50.

According to the above mentioned, the first, second and third hating elements may be utilized such that an increasing temperature gradient is provided from the precursor container 80 to the precursor connection 50. Thus, the first heating element 61 may be arranged to operate in first temperature and the second heating element 71 at a second temperature which is higher than the first temperature.

Further, the second heating element 71 may be arranged to operate in second temperature and the third heating element 52 at a third temperature which is higher than the second temperature. Thus, the temperature of the precursor may increase from the precursor container 80 to the precursor connection 50. Therefore, condensation of the precursor may be avoided.

The temperatures of the first, second and third heating elements 61, 71, 52 are controlled with a control unit (not shown) by utilizing the temperature sensors 62, 72, 78.

Figure 7:
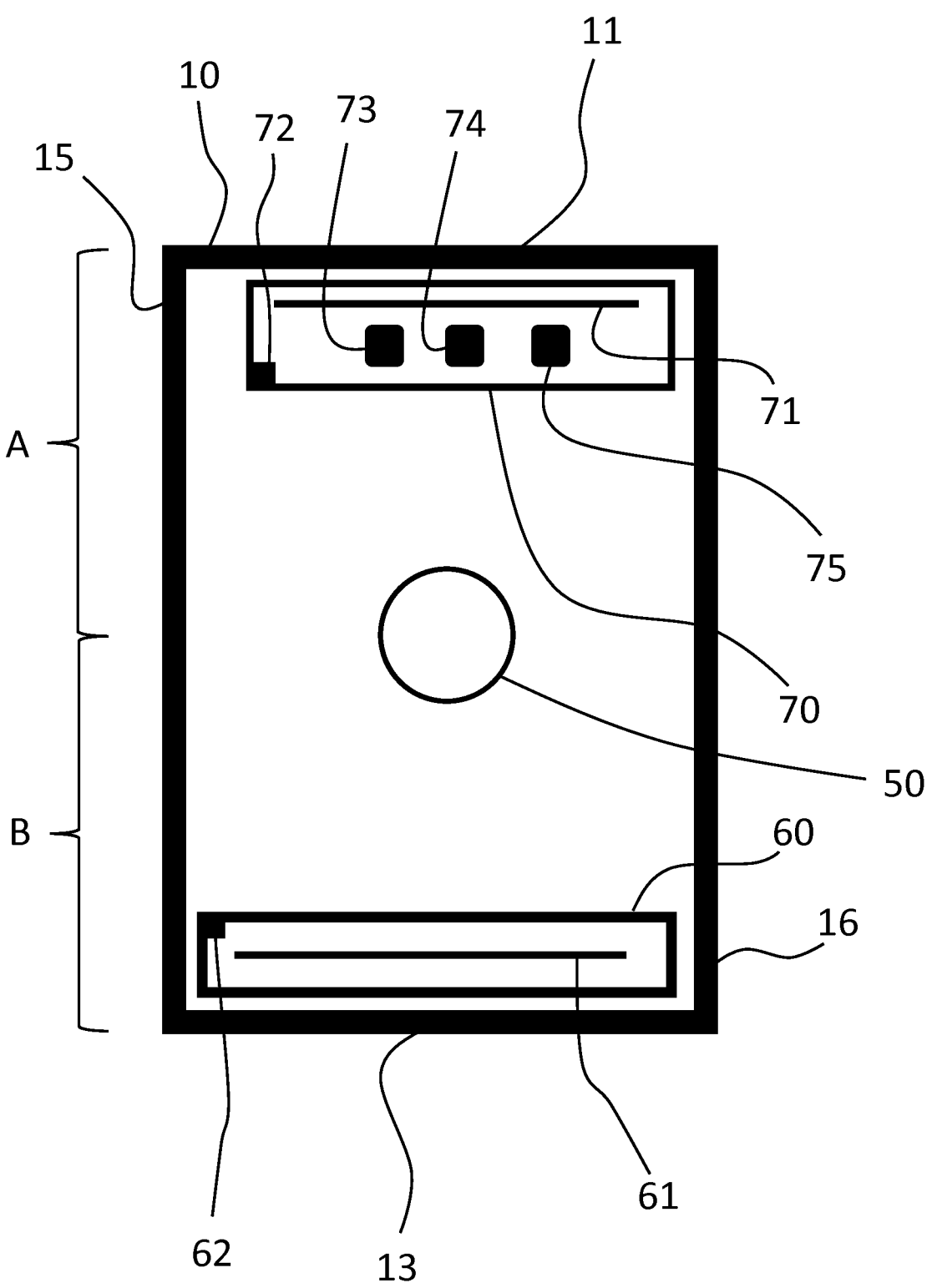
FIG. 7 shows another schematic front view and chamber space one precursor supply chamber according to the present invention.

FIG. 7 shows schematically the arrangement of the precursor container holder 60, the first heating element 61, the precursor supply element 70 and the second heating element 71.

The precursor supply chamber 10 and the inner chamber space 19 has a lower part B and an upper part A in the vertical direction. The upper part A extends from the top wall 11 downwards and the lower part B extends from the bottom wall 13 upwards, as shown in FIG. 7.

The first heating element 61 is provided to lower part B of the chamber space 19 of the precursor supply chamber 10. The second heating element 71 is provided to the upper part A of the chamber space of the precursor supply chamber 10.

The precursor container holder 60 is arranged to lower part B of the chamber space 19 of the precursor supply chamber 10.

The precursor container holder 60 provided with the first heating element 61 is arranged to lower part B of the chamber space 19 of the precursor supply chamber 10.

The precursor supply element 70 is arranged to upper part A of the chamber space of the precursor supply chamber 10.

The precursor supply element 70 provided with the second heating element is arranged to upper part A of the chamber space of the precursor supply chamber 10.

Thus, the precursor supply element 70 is arranged above the precursor container holder 60 inside the precursor supply chamber 10. Further, the second heating element 71 is provided above the first heating element 61 in the precursor supply chamber.

Figure 8:
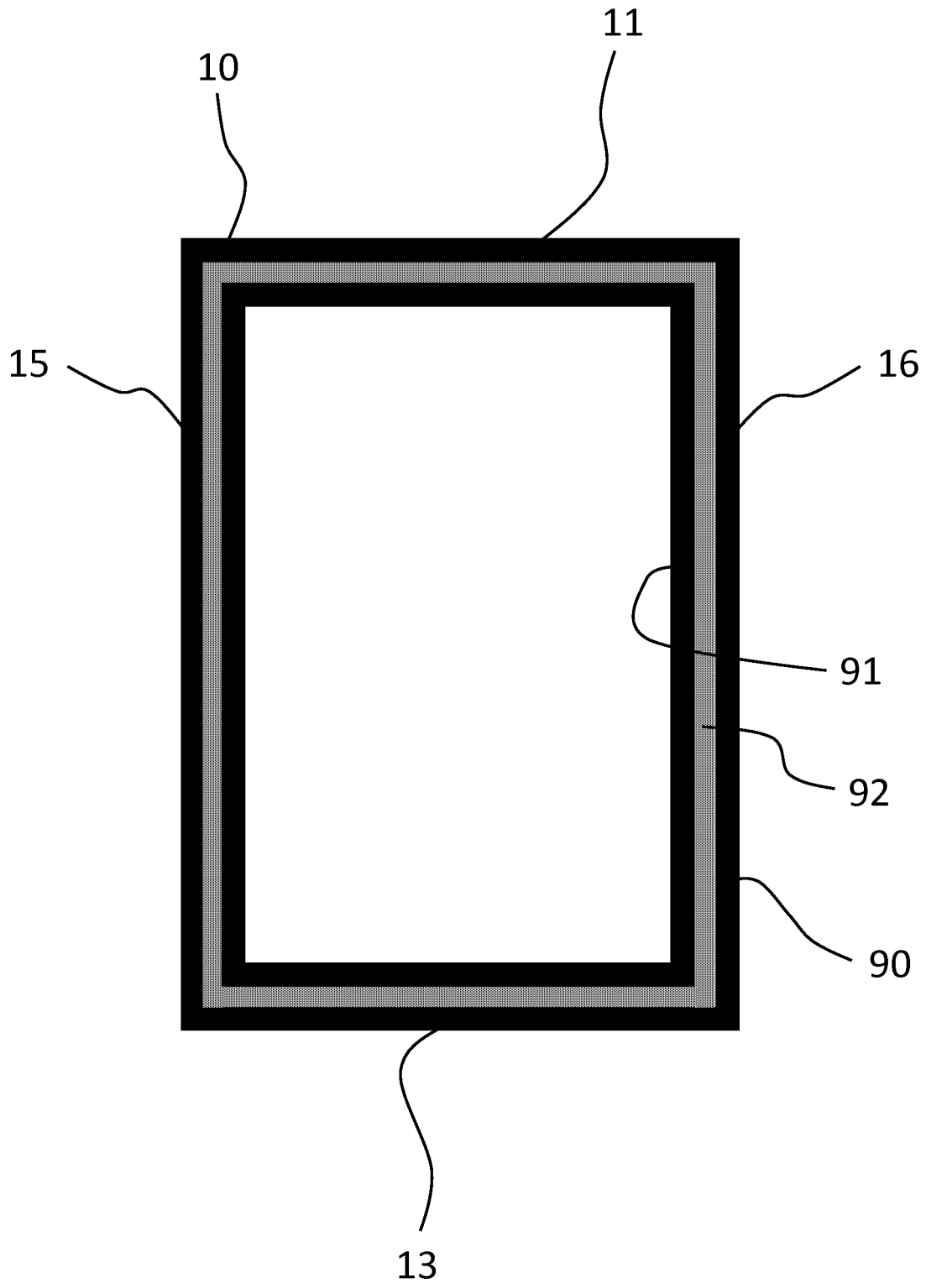
FIG. 8 shows schematically structure of the chamber walls of one precursor supply chamber according to the present invention.

FIG. 8 shows the structure of the chamber walls 11, 13, 15, 16, 18 according to one embodiment. The chamber walls 11, 13, 15, 16, 18 are made of metal such that the metal chamber walls 11, 13, 15, 16, 18 define the chamber space 19 of the precursor supply chamber 10.

As shown in FIG. 8, the chamber walls 11, 13, 15, 16, 18 comprise a metal inner wall layer 91 defining the chamber space 19 of the precursor supply chamber. Further, the chamber walls 11, 13, 15, 16, 18 comprise the metal inner wall layer 91 and a metal outer wall layer 90 the metal inner wall layer 91 defining the chamber space 19 of the precursor supply chamber 10.

The metal may be stainless steel, aluminium or the like metal. Instead of metal also some other material may be used.

Further, the chamber walls 11, 13, 15, 16, 18 are provided with thermal insulation 92. The thermal insulation layer 92 is arranged between the metal inner wall layer 91 and the metal outer wall layer 90. Accordingly, the thermal insulation 92 is encapsulated inside the chamber walls 11, 13, 15, 16, 18 between the metal surface layers. The thermal insulation layer prevents thermal energy from escaping the precursor supply chamber 10.

Figure 9:
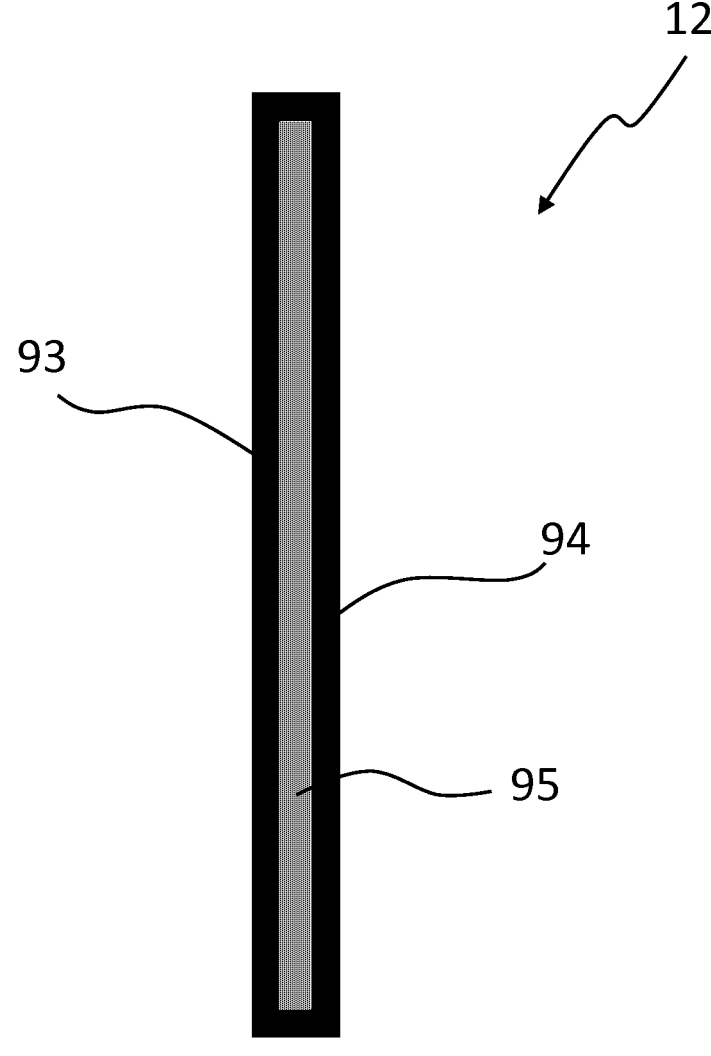
FIG. 9 shows schematically structure of a door of one precursor supply chamber according to the present invention.

FIG. 9 shows the door 12 of the precursor supply chamber 10. The door 12 has a similar structure as the chamber walls 11, 13, 15, 16, 18. The door 12 is made of metal and has a metal inner door layer 94 towards the chamber space 19 of the precursor supply chamber 10.

As shown in FIG. 9, the door 12 comprises the metal inner door layer 94 defining the chamber space 19 of the precursor supply chamber 10. Further, the door 12 comprise the metal inner door layer 94 and a metal outer door layer 93 the metal inner door layer 94 defining the chamber space 19 of the precursor supply chamber 10.

The metal may be stainless steel, aluminium or the like metal. Instead of metal also some other material may be used.

Further, the door 12 is provided with thermal insulation 95. The thermal insulation layer 95 is arranged between the metal inner door layer 94 and the metal outer door layer 93. Accordingly, the thermal insulation 95 is encapsulated inside the door 12 between the metal surface layers. The thermal insulation layer prevents thermal energy from escaping the precursor supply chamber 10 via the door 12.

Figure 10:
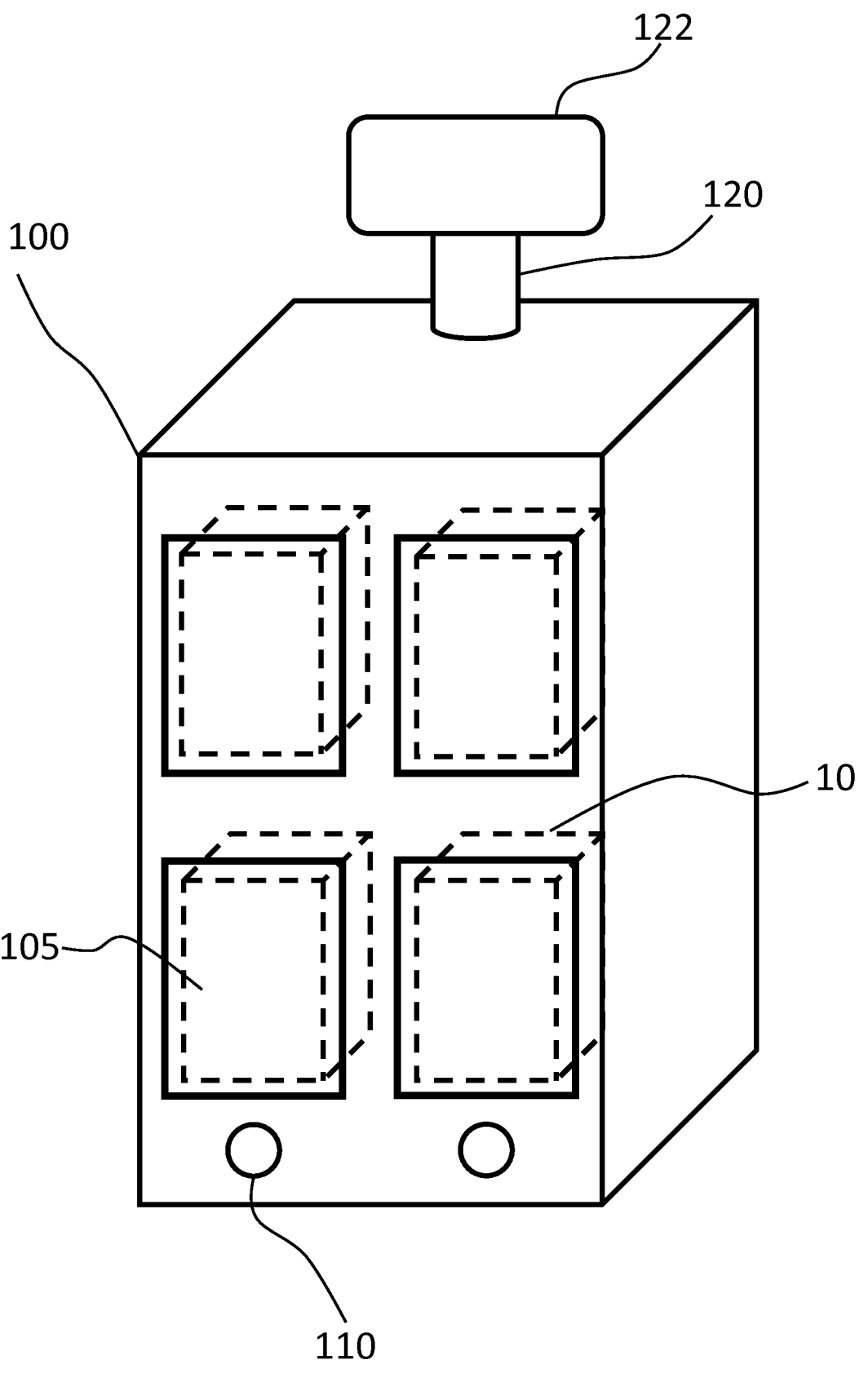
FIG. 10 shows schematically one embodiment of a precursor supply cabinet according to the present invention.

The precursor supply chamber or chambers 10 are arranged into a precursor supply cabinet 100 of a precursor supply system in connection with an atomic layer deposition apparatus, as shown in FIG. 10. The precursor supply cabinet 100 comprises cabinet walls defining inner cabinet space. The precursor supply cabinet 100 comprises one or more ventilation openings 110 arranged to provide ventilation gas into inner cabinet space of the precursor supply cabinet 100 from outside the precursor cabinet 100. The precursor supply cabinet 100 further comprises a ventilation discharge connection 120, 122 arranged to discharge ventilation gas from the inner cabinet space of the precursor supply cabinet 100.

The ventilation discharge connection comprises a ventilation outlet 120 open to the inner cabinet space. A suction device of under pressure device 122 is connected to the ventilation outlet 120 from discharging the ventilation gas from the inner cabinet space and also from outside the inner cabinet space into the inner cabinet space via the one or more ventilation openings 110.

Accordingly, the precursor supply cabinet 100 provides a ventilated inner cabinet space.

The precursor supply cabinet 100 further comprises one or more gas tight precursor supply chambers 10 arranged inside the precursor supply cabinet 100 into the inner cabinet space. The one or more gas tight precursor supply chambers 10 are precursor supply chambers as disclosed above for arranging the one or more gas tight precursor supply chambers 10 in the ventilated precursor supply cabinet 100.

In one embodiment, the one or more precursor supply chambers 10 are arranged in the inner cabinet space spaced apart from each other.

In one embodiment, the one or more precursor supply chambers 10 are arranged in the inner cabinet space spaced apart from cabinet walls.

In another embodiment, the one or more precursor supply chambers 10 are arranged in the inner cabinet space spaced apart from each other and from the cabinet walls.

The precursor supply cabinet 100 comprise cabinet doors 105 aligned and/or opposite the precursor supply chambers 10 in the precursor supply cabinet 100.

Figure 11:
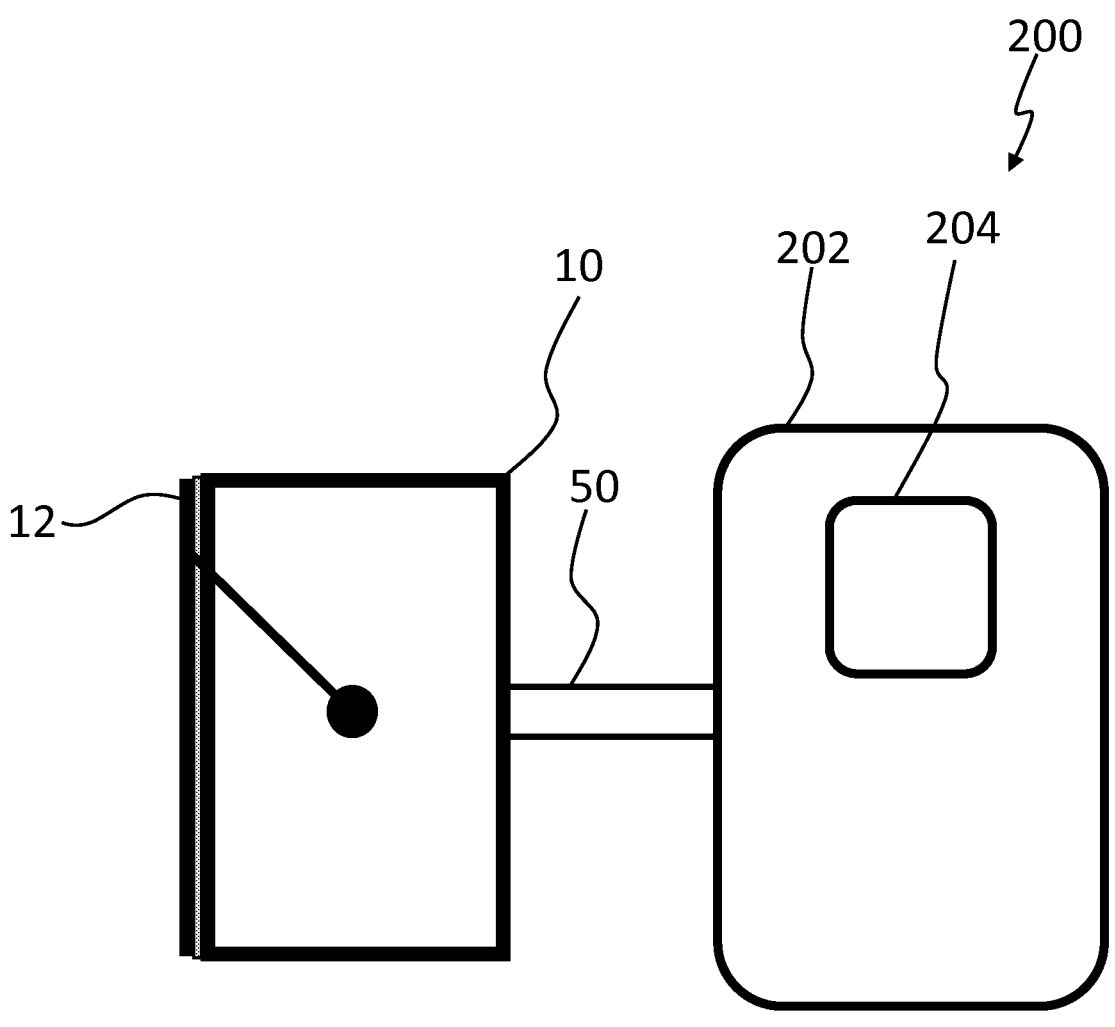
FIG. 11 shows schematically the precursor supply chamber and atomic layer deposition apparatus.

FIG. 11 shows schematically, that the precursor supply chambers 10 are connected to an atomic layer deposition reactor or apparatus 200. The atomic layer deposition apparatus 200 comprises a vacuum chamber 202 and a reaction chamber 204 inside the vacuum chamber 202. The precursor is fed from the precursor container 80 inside the precursor supply chamber 10 to the reaction chamber 204 in which a substrate is processed with the precursor. The precursor supply chambers 10 may be arranged inside the precursor supply cabinet 100, or alternatively the precursor supply cabinet 100 may be omitted.

The invention has been described above with reference to the examples shown in the figures. However, the invention is in no way restricted to the above examples but may vary within the scope of the claims.

The invention claimed is:

1. A precursor supply chamber for accommodating a precursor container in connection with an atomic layer deposition apparatus, the precursor supply chamber comprises chamber walls including a top wall, a bottom wall, and at least one side wall extending between the top wall and the bottom wall, the chamber walls defining a chamber space inside the precursor supply chamber, the precursor supply chamber comprising:

a chamber door assembly arranged to close the precursor supply chamber in gas tight manner;

a first heating element provided to the precursor supply chamber and arranged to heat the precursor container inside the chamber space of the precursor supply chamber;

a gas tight precursor connection provided to the chamber walls for supplying precursor from the precursor container outside the precursor supply chamber;

a precursor container holder for holding the precursor container, the precursor container holder is arranged at a bottom of the chamber space of the precursor supply chamber, the first heating element is provided to the precursor container holder for heating the precursor container held by the precursor container holder;

a precursor supply element arranged to control precursor supply from the precursor container to outside the precursor supply chamber via the gas tight precursor connection, the precursor supply element is arranged at a top of the chamber space of the precursor supply chamber above the precursor container holder inside the precursor supply chamber, the precursor supply element includes one or more gas valves arranged to control precursor supply from the precursor container outside the precursor supply chamber via the gas tight precursor connection;

a second heating element provided above the precursor container holder in the precursor supply chamber, wherein the second heating element is positioned in contact with the precursor supply element in the precursor supply chamber, the second heating element arranged to heat the precursor supply element and the one or more gas valves; and a third heating element provided to the gas tight precursor connection, wherein the precursor supply chamber further comprises:

a first temperature sensor arranged in connection with the first heating element;

a second temperature sensor arranged in connection with the second heating element; and a third temperature sensor arranged in connection with the precursor connection for measuring the temperature of the precursor connection, a precursor supply conduit in the precursor connection and the temperature of the precursor, and wherein the temperatures of the first, second and third heating elements are controlled with a control unit by utilizing the temperature sensors.

2. The precursor supply chamber according to claim 1, wherein the first heating element is provided to lower part (B) of the chamber space of the precursor supply chamber.

3. The precursor supply chamber according to claim 1, wherein:

the second heating element is provided above the first heating element in the precursor supply chamber.

4. The precursor supply chamber according to claim 1, wherein the third heating element is in contact with the gas tight precursor connection.

5. The precursor supply chamber according to claim 1, wherein:

the chamber walls are made of metal such that the metal chamber walls define the chamber space of the precursor supply chamber; or the chamber walls comprise a metal inner wall layer defining the chamber space of the precursor supply chamber; or the chamber walls comprise a metal inner wall layer and a metal outer wall layer, the metal inner wall layer defining the chamber space of the precursor supply chamber.

6. The precursor supply chamber according to claim 5, wherein:

the chamber walls are provided with thermal insulation; or the chamber walls are provided with thermal insulation layer arranged between the metal inner wall layer and the metal outer wall layer; or the chamber walls comprise metal surface layers and a thermal insulation encapsulated inside the chamber walls between the metal surface layers.

7. The precursor supply chamber according to claim 1, wherein the chamber door assembly comprises a chamber door and a sealing member arranged to seal the precursor supply chamber when the chamber door is in closed position.

8. The precursor supply chamber according to claim 1, wherein the chamber door assembly comprises the chamber door and a closing mechanism arranged to pre-stress the chamber door to the closed position.

9. A precursor supply cabinet in connection with an atomic layer deposition apparatus, wherein the precursor supply cabinet comprises:

one or more ventilation openings arranged to provide ventilation gas into the precursor supply cabinet;

a ventilation discharge connection arranged to discharge ventilation gas from the precursor supply cabinet; and one or more gas tight precursor supply chambers inside the precursor supply cabinet, the one or more gas tight precursor supply chambers are arranged to accommodate a precursor container in connection with an atomic layer deposition apparatus, wherein the precursor supply chamber comprises chamber walls defining a chamber space inside precursor supply chamber, the precursor supply chamber comprising:

a chamber door assembly arranged to close the precursor supply chamber in gas tight manner;

a first heating element provided to the precursor supply chamber and arranged to heat the precursor container inside the chamber space of the precursor supply chamber; and a gas tight precursor connection provided to the chamber walls for supplying precursor from the precursor container outside the precursor supply chamber, wherein the one or more gas tight precursor supply chambers are precursor supply chambers according to claim 1.

10. The precursor supply chamber according to claim 1, wherein the second heating element is spaced from the one or more gas valves.

11. The precursor supply chamber according to claim 1, wherein the precursor container holder is in contact with the bottom wall of the precursor supply chamber.

12. The precursor supply chamber according to claim 11, wherein the precursor supply element is in contact with top wall of the chamber space of the precursor supply chamber.

13. The precursor supply chamber according to claim 1, wherein the precursor supply element is in contact with top wall of the chamber space of the precursor supply chamber.

14. The precursor supply chamber according to claim 1, wherein the third heating element is positioned outside of the precursor supply chamber.

15. A precursor supply cabinet in connection with an atomic layer deposition apparatus, wherein the precursor supply cabinet comprises:

one or more ventilation openings arranged to provide ventilation gas into the precursor supply cabinet;

a ventilation discharge connection arranged to discharge ventilation gas from the precursor supply cabinet; and one or more gas tight precursor supply chambers inside the precursor supply cabinet, the one or more gas tight precursor supply chambers are arranged to accommodate a precursor container in connection with an atomic layer deposition apparatus, wherein the precursor supply chamber comprises chamber walls including a top wall, a bottom wall, and at least one side wall extending between the top wall and the bottom wall, the chamber walls defining a chamber space inside precursor supply chamber, the precursor supply chamber comprising:

a chamber door assembly arranged to close the precursor supply chamber in gas tight manner;

a first heating element provided to the precursor supply chamber and arranged to heat the precursor container inside the chamber space of the precursor supply chamber;

a precursor container holder for holding the precursor container and arranged at a bottom of the chamber space of the precursor supply chamber;

a precursor supply element arranged to control precursor supply from the precursor container to outside the precursor supply chamber, the precursor supply element is spaced from and above the first heating element inside the precursor supply chamber, the precursor supply element is arranged at a top of the chamber space of the precursor supply chamber;

a second heating element provided above the first heating element in the precursor supply chamber, wherein the second heating element is positioned in contact with the precursor supply element in the precursor supply chamber;

a gas tight precursor connection provided to the chamber walls for supplying precursor from the precursor container outside the precursor supply chamber; and a third heating element provided to the gas tight precursor connection, wherein the precursor supply chamber further comprises:
    a first temperature sensor arranged in connection with the first heating element;
    a second temperature sensor arranged in connection with the second heating element; and
    a third temperature sensor arranged in connection with the precursor connection for measuring the temperature of the precursor connection, a precursor supply conduit in the precursor connection and the temperature of the precursor, and
    wherein the temperatures of the first, second and third heating elements are controlled with a control unit by utilizing the temperature sensors.

16. The precursor supply cabinet according to claim 15, wherein the precursor supply element includes one or more gas valves arranged to control precursor supply from the precursor container outside the precursor supply chamber via the gas tight precursor connection, wherein the second heating element is spaced from the one or more gas valves.

17. The precursor supply cabinet according to claim 15, wherein the precursor container holder is in contact with the bottom wall of the precursor supply chamber.

18. The precursor supply chamber according to claim 17, wherein the precursor supply element is in contact with top wall of the chamber space of the precursor supply chamber.

19. The precursor supply chamber according to claim 15, wherein the precursor supply element is in contact with top wall of the chamber space of the precursor supply chamber.

20. The precursor supply chamber according to claim 15, wherein the third heating element is positioned outside of the precursor supply chamber.

\* \* \* \* \*